United States Patent
Dai et al.

(10) Patent No.: US 11,902,644 B2
(45) Date of Patent: Feb. 13, 2024

(54) CAMERA MODULE AND METHOD FOR MANUFACTURING THE SAME

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Jun Dai, Qinhuangdao (CN); Mei Yang, Qinhuangdao (CN); Ming-Jaan Ho, New Taipei (TW)

(73) Assignees: QING DING PRECISION ELECTRONICS (HUAIAN) CO., LTD, Huai an (CN); Avary Holding (Shenzhen) Co., Limited., Shenzhen (CN)

(*) Notice: Subject to any disclaimer, the term of this patent is extended or adjusted under 35 U.S.C. 154(b) by 161 days.

(21) Appl. No.: 17/683,305

(22) Filed: Feb. 28, 2022

(65) Prior Publication Data
US 2022/0191361 A1 Jun. 16, 2022

Related U.S. Application Data

(63) Continuation-in-part of application No. PCT/CN2020/097799, filed on Jun. 23, 2020.

(51) Int. Cl.
*H04N 5/54* (2006.01)
*H04N 5/225* (2006.01)
*H04N 23/54* (2023.01)
*H05K 1/03* (2006.01)
(Continued)

(52) U.S. Cl.
CPC ............. *H04N 23/54* (2023.01); *H04N 23/55* (2023.01); *H05K 1/0306* (2013.01); *H05K 1/111* (2013.01); *H05K 1/0393* (2013.01)

(58) Field of Classification Search
CPC ....................................................... H04N 5/225
See application file for complete search history.

(56) References Cited

U.S. PATENT DOCUMENTS 10,021,329 B2 * 7/2018 Ohmaru ................... H04N 5/32
10,163,967 B2 * 12/2018 Okamoto .......... H01L 27/14636
(Continued)

FOREIGN PATENT DOCUMENTS

| CN | 102570762 A | 7/2012 |
|---|---|---|
| CN | 107820362 A | 3/2018 |
| TW | M539074 U | 4/2017 |

*Primary Examiner* — Mushfikh I Alam
(74) *Attorney, Agent, or Firm* — ScienBiziP, P.C.

(57) ABSTRACT

A camera module includes a holder, a lens in the holder, magnets disposed on an outer wall of the holder, and a circuit board assembly. The circuit board assembly includes an outer wiring substrate, and first and second inner wiring substrates spaced out on a surface of the outer wiring substrate. The first inner wiring substrate surrounds the holder and includes a first dielectric layer and a first inner wiring layer thereon. The first inner wiring layer includes coils of wound wire in the first inner wiring layer, and each of the coils corresponds to one of the magnets. The second inner wiring substrate includes a second inner wiring layer, a thickness of each of the coils is greater than a thickness of the second inner wiring layer. A method for manufacturing the camera module is also disclosed.

15 Claims, 9 Drawing Sheets

(51) Int. Cl.
*H05K 1/11* (2006.01)
*H04N 23/55* (2023.01)

(56) References Cited

U.S. PATENT DOCUMENTS

2010/0103288 A1* 4/2010 Ahn .................. H04N 25/60
  348/E5.031
2015/0070577 A1* 3/2015 Ikemoto .............. H04N 5/2253
  348/374
2019/0096206 A1* 3/2019 Nakagawa ............ H04N 25/74

* cited by examiner

US 11,902,644 B2

CAMERA MODULE AND METHOD FOR MANUFACTURING THE SAME

FIELD

The subject matter herein generally relates to cameras, in particular to a camera module and a method for manufacturing the same.

BACKGROUND

In order to improve an imaging quality, a camera can be equipped with an optical image stabilizing device and/or an automatic focusing device. Functions of the optical image stabilizing device and the automatic focusing device can be achieved by using electromagnetism. That is, a voice coil motor (VCM) is used to control the camera to achieve the functions.

In general, an enamelled copper conductor is connected to a conductive wire of a circuit board to form a coil which is used to provide a magnetic force for a voice coil motor. However, a diameter of the enamelled copper conductor is greater than 20 μm, and a thickness of an insulating layer of the enamelled copper conductor is greater than 50 μm, which are not conducive to miniaturization of a camera. In addition, the enamelled copper conductor has a high cost, and the coil formed by the enamelled copper conductor has a high resistance.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

Figure 1:
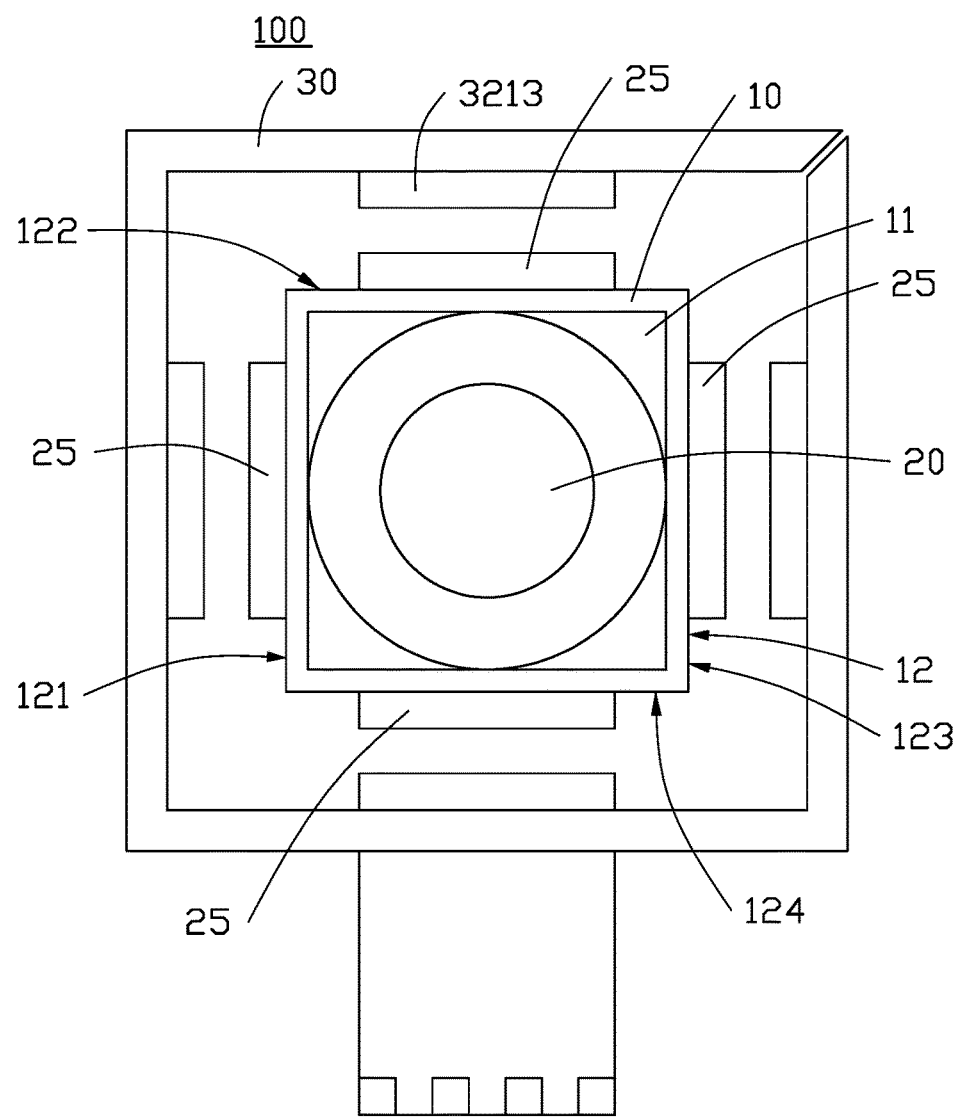
FIG. 1 is a schematic structural diagram of a camera module according to an embodiment of the present disclosure.

Referring to FIG. 1, an embodiment of a camera module 100 includes a holder 10, a lens 20, a plurality of magnets 25, and a circuit board assembly 30.

The holder 10 is hollow and includes an inner cavity 11 to accommodate the lens 20.

In one embodiment, the holder 10 is cuboid and includes an outer wall 12. The outer wall 12 includes a first surface 121, a second surface 122, a third surface 123, and a fourth surface 124 which are sequentially connected in such order. The first surface 121, the second surface 122, the third surface 123, and the fourth surface 124 are arranged around the cuboid holder 10.

The magnets 25 are fixedly disposed on the outer wall 12 of the holder 10. The magnets 25 are permanent magnets and are used to generate a magnetic field.

In one embodiment, the magnets 25 are respectively disposed on the first surface 121, the second surface 122, the third surface 123, and the fourth surface 124.

Figure 2:
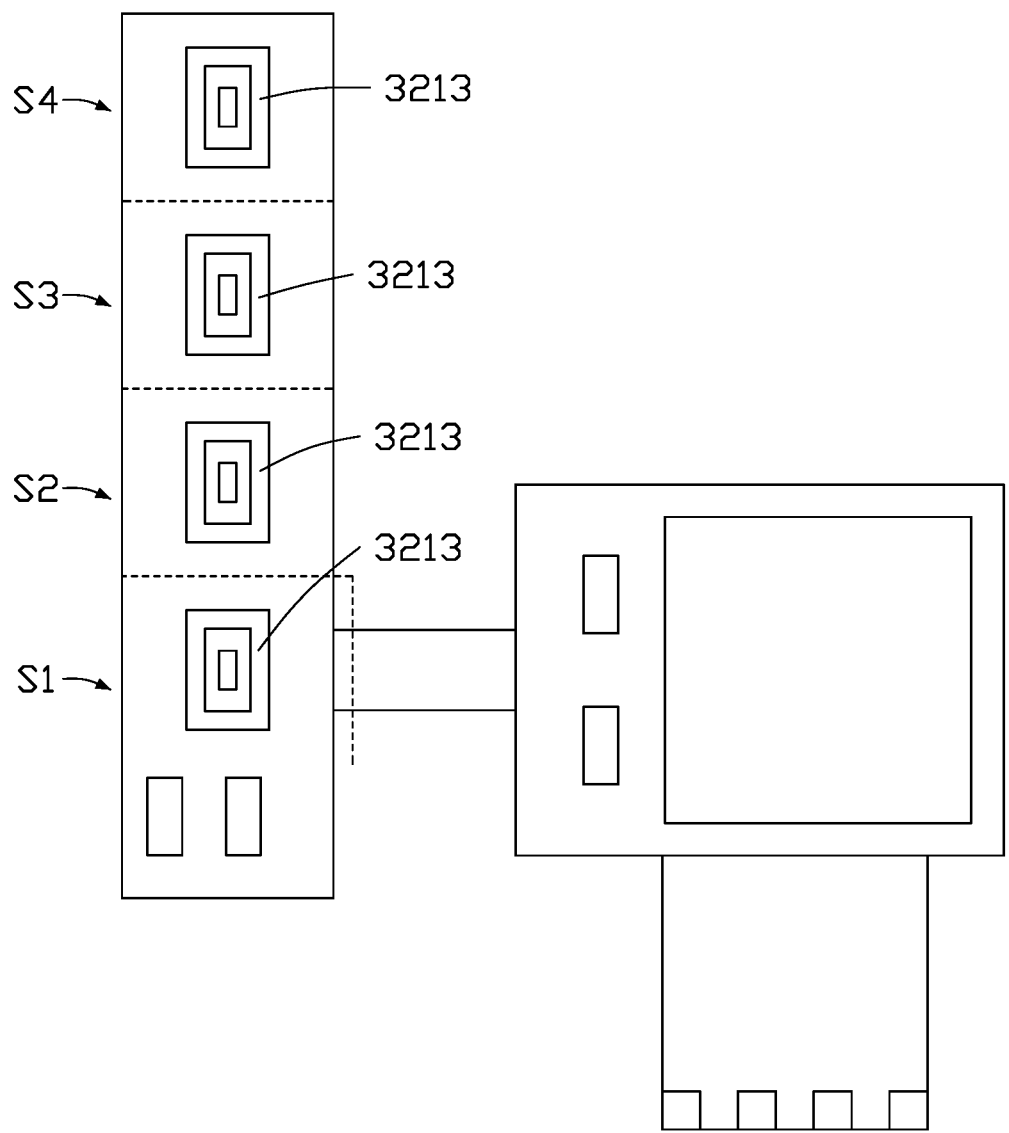
FIG. 2 is a top view of a flat circuit board assembly of the camera module of FIG. 1.
Figure 3:
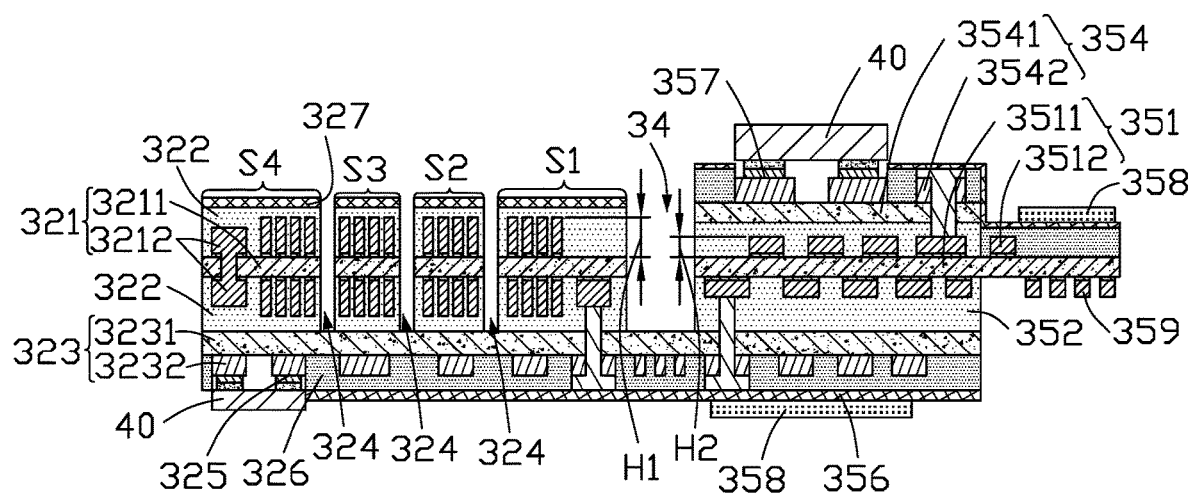
FIG. 3 is a cross-sectional view of the circuit board assembly of FIG. 2.

Referring to FIGS. 2 and 3, the circuit board assembly 30 includes an outer wiring substrate 323, a first inner wiring substrate 321, and a second inner wiring substrate 351. The first inner wiring substrate 321 and the second inner wiring substrate 351 are arranged on a same surface of the outer wiring substrate 323 and are apart from each other. The circuit board assembly 30 is integrally formed and not assembled of different wiring substrates, which improves integrity of signals of the circuit board assembly 30 and improves a level of integration of the circuit board assembly 30.

The circuit board assembly 30 may be a double-layer or multi-layer circuit board. In one embodiment, the circuit board assembly 30 is a multi-layer circuit board.

The outer wiring substrate 323 includes a second dielectric layer 3231 and an outer wiring layer 3232 formed on a surface of the second dielectric layer 3231. The outer wiring layer 3232 is located on a surface of the second dielectric layer 3231 away from the first inner wiring substrate 321.

The second dielectric layer 3231 functions as a base layer providing support and is flexible. A material of the second dielectric layer 3231 may be polyimide (PI), polyethylene terephthalate (PET), polyethylene phthalate (PEN), polyethylene (PE), Teflon, liquid crystal polymer (LCP), polyvinyl chloride (PVC), etc.

The outer wiring layer 3232 includes at least one first connection pad 325. The first connection pad 325 is configured to connect an electronic component 40, such as a capacitor, a resistor, an inductor, or a chip. In one embodiment, the first connection pad 325 connects to a control chip.

The first inner wiring substrate 321 faces and surrounds the holder 10. The first inner wiring substrate 321 includes a first dielectric layer 3211 and two first inner wiring layers 3212 formed on both surfaces of the first dielectric layer 3211.

A material of the first dielectric layer 3211 may be polyimide (PI), glass fiber epoxy resin (FR4), polyethylene terephthalate (PET), polyethylene naphthalate (PEN), polyethylene (PE), etc.

The first inner wiring layers 3212 are made of copper. A conductive wire of each of the first inner wiring layers 3212 is wound multiple times to form a coil 3213. There are many coils 3213. Each of the coils 3213 corresponds to one of the magnets 25. The first inner wiring layers 3212 on both surfaces of the first dielectric layer 3211 are electrically connected to each other. When a current is applied to one coil 3213, the coil 3213 generates a magnetic field, which interacts with one magnet 25, thereby moving the lens 20 along an optical axis.

Figure 4:
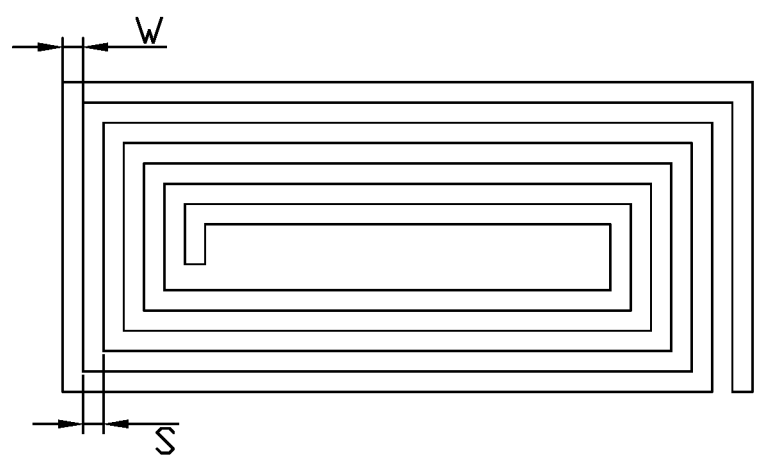
FIG. 4 is a schematic structural diagram of a coil of the circuit board assembly of FIG. 2.

Each of the coils 3213 has a helical structure, in shape of a square, a race track, or a circle. A rotational direction of a magnetic field produced by one coil 3213 on one surface of the first dielectric layer 3211 coincides with a rotational direction of a magnetic field produced by another coil 3213 on another surface of the first dielectric layer 3211, and the coils 3213 on both surfaces of the first dielectric layer 3211 are connected in series, so that an effective length of the coils 3213 is increased. Referring to FIG. 4, each of the coils 3213 is in a square shape, and has a line width W and a wire pitch S. The line width W is a width of the copper wire, and the wire pitch S is a distance between adjacent copper wires in each of the coils 3213. An effective length of each of the coils 3213 can be increased by reducing the line width W and the wire pitch S. Each of the coils 3213 has a thickness H1 in a direction perpendicular to the first dielectric layer 3211. The thickness H1 is a thickness of the first inner wiring layer 3212. A ratio of the thickness H1 to the wire pitch S is greater than 3, so that a resistance of each coil 3213 is reduced on the basis of ensuring the effective length of each coil 3213, reducing a power consumption of the camera module 100.

The first inner wiring substrate 321 and the outer wiring substrate 323 are bonded through a first inner adhesive layer 322. In one embodiment, two first inner adhesive layers 322 are arranged on both sides of the first inner wiring substrate 321 and cover the first inner wiring layers 3212.

The circuit board assembly 30 also includes a plurality of second openings 324. Each of the second openings 324 penetrates the first inner wiring substrate 321 and the first inner adhesive layers 322. That is, a bottom of each of the second openings 324 is located above the outer wiring substrate 323. An arrangement of the second openings 324 allows bending and flexing of the circuit board assembly 30.

The second openings 324 divide the first inner wiring substrate 321 into a first area S1, a second area S2, a third area S3, and a fourth area S4. A portion of the first inner wiring layers 3212 in the first area S1 corresponds to one magnet 25 on the first surface 121, a portion of the first inner wiring layers 3212 in the second area S2 corresponds to one magnet 25 on the second surface 122, a portion of the first inner wiring layers 3212 in the third area S3 corresponds to one magnet 25 on the third surface 123, and a portion of the first inner wiring layers 3212 in the fourth area S4 corresponds to one magnet 25 on the fourth surface 124.

The second inner wiring substrate 351 includes a third dielectric layer 3511 and two second inner wiring layers 3512 formed on both surfaces of the third dielectric layer 3511.

A material of the third dielectric layer 3511 may be the same as the material of the first dielectric layer 3211.

The second inner wiring layers 3512 are spaced apart from the first inner wiring layers 3212. That is, one first opening 34 is arranged between the first inner wiring layers 3212 and the second inner wiring layers 3512. Thus, the circuit board assembly 30 can be bent. The second inner wiring layer 3512 has a thickness H2 in a direction perpendicular to the third dielectric layer 3511, and the thickness H1 of the first inner wiring layer 3212 is greater than the thickness H2 of the second inner wiring layer 3512.

Two second inner adhesive layers 352 are disposed on sides of the second inner wiring substrate 351 and respectively cover the second inner wiring layers 3512. One of the second inner adhesive layers 352 bonds the second inner wiring substrate 351 and the outer wiring substrate 323 together.

The circuit board assembly 30 also includes a third inner wiring substrate 354. The third inner wiring substrate 354 is disposed on a surface of the second inner wiring substrate 351 away from the outer wiring substrate 323. The third inner wiring substrate 354 and the second inner wiring substrate 351 are bonded together by the other one of the second inner adhesive layers 352.

The third inner wiring substrate 354 includes a fourth dielectric layer 3541 and a third inner wiring layer 3542 formed on the fourth dielectric layer 3541. The third inner wiring layer 3542 is located on a surface of the fourth dielectric layer 3541 away from the second inner wiring substrate 351.

The third inner wiring layer 3542 includes at least one second connection pad 357. The second connection pad 357 connects with electronic components 40. In one embodiment, the second connection pad 357 connects with an image sensor.

The circuit board assembly 30 also includes an electric connection portion 359. The electric connection portion 359 is electrically connected to one of the second inner wiring layers 3512 and connects with an electronic component.

The circuit board assembly 30 also includes a first cover layer 327. The first cover layer 327 covers a surface of one of the first inner adhesive layers 322 away from the outer wiring substrate 323.

The circuit board assembly 30 also includes two second cover layer 356. Two outer adhesive layers 326 cover surfaces of the outer wiring layer 3232 and the third inner wiring layer 3542. The second cover layers 356 cover surface of the outer adhesive layers 326.

The circuit board assembly 30 also includes a reinforcing plate 358, increasing a strength of the circuit board assembly 30. A position and the number of the reinforcing plates 358 can be set as needed. In one embodiment, one reinforcing plate 358 is disposed on a surface of the second cover layer 356 away from the outer wiring layer 3232 and is located in an orthographic projection area of the outer wiring layer 3232. Another reinforcing plate 358 is disposed on a surface of the second cover layer 356 away from the outer wiring layer 3232 and is located in an orthographic projection area of the electric connection portion 359.

The present disclosure also provides a method for manufacturing the camera module 100. The method is provided by way of example, as there are a variety of ways to carry out the method. The method can begin at step S1.

At step S1, referring to FIG. 5 to FIG. 14, the circuit board assembly 30 is provided.

A method for providing the circuit board assembly 30 can begin at step S101.

Figure 5:
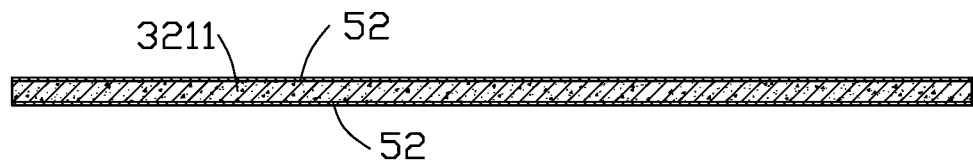
FIG. 5 is a cross-sectional view of a double-sided copper clad laminate according to an embodiment of the present disclosure.

At step S101, referring to FIG. 5, a double-sided copper clad laminate 50 is provided. The double-sided copper clad laminate 50 includes the first dielectric layer 3211 and two first copper layers 52 on both surfaces of the first dielectric layer 3211.

Figure 6:
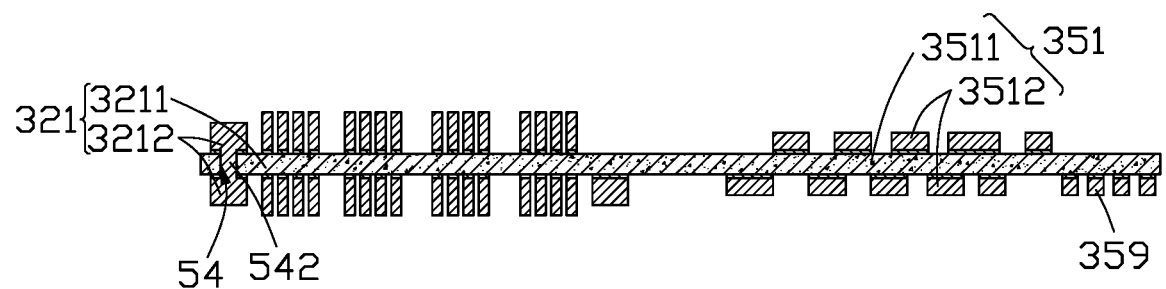
FIG. 6 is a cross-sectional view showing first inner wiring layers and second inner wiring layers formed from the double-sided copper clad laminate of FIG. 5.

At step S102, referring to FIG. 6, the first inner wiring layers 3212 are formed on both surfaces of the first dielectric layer 3211, thereby obtaining the first inner wiring substrate 321. The second inner wiring layers 3512 are formed on both surfaces of the first dielectric layer 3211, thereby obtaining the second inner wiring substrate 351. It should be noted that the third dielectric layer 3511 refers to a portion of the first dielectric layer 3211 with the second inner wiring layers 3512 in FIG. 6. The second inner wiring substrate 351 is connected to the first inner wiring substrate 321 through the first dielectric layer 3211. The first inner wiring layers 3212 and the second inner wiring layers 3512 are apart from each other.

In one embodiment, the first inner wiring layers 3212 and the second inner wiring layers 3512 are formed by a method which includes steps of pressing a film, exposure, development, electroplating, stripping the film, and etching. A thickness of each of the first inner wiring layers 3212 is greater than a thickness of one of the second inner wiring layers 3512. Each of the first inner wiring layers 3212 is divided into the first area S1, the second area S2, the third area S3, and the fourth area S4. A portion of the first inner wiring layers 3212 in each of the first to fourth areas S1-S4 has a helical structure. That is, the portion of the first inner wiring layers 3212 in each of the first to fourth areas S1-S4 forms one coil 3213. A rotational direction of a magnetic field produced by one first inner wiring layer 3212 on one surface of the first dielectric layer 3211 coincides with a rotational direction of a magnetic field produced by another first inner wiring layer 3212 on another surface of the first dielectric layer 3211. Each of the coils 3213 has a thickness H1 in a direction perpendicular to the first dielectric layer 3211. The ratio of the thickness H1 to the wire pitch S is greater than 3.

Before forming the first inner wiring layer 3212 and the second inner wiring layer 3512, the method also includes the step of forming a first through hole 54 on the double-sided copper clad laminate 50. The first through hole 54 penetrates one of the two first copper layers 52, the first dielectric layer 3211, and another one of the two first copper layers 52. The first through hole 54 can be formed by mechanical drilling or laser drilling. In one embodiment, the first through hole 54 is formed by laser drilling.

In the electroplating process, a first conductive pillar 542 is formed in the first through hole 54, the first conductive pillar 542 electrically connects the two first inner wiring layers 3212 located on both surfaces of the first dielectric layer 3211.

In the electroplating process, the electric connection portion 359 is formed as needed. The electric connection portion 359 is electrically connected to one of the second inner wiring layers 3512 and is configured to connect with electronic components.

Figure 7:
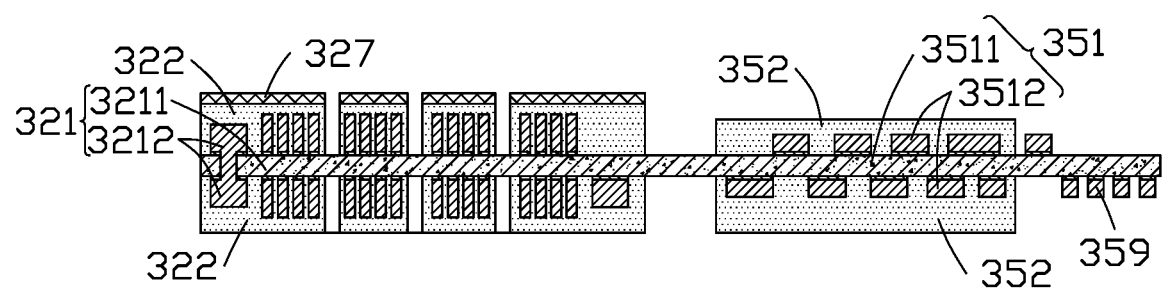
FIG. 7 is a cross-sectional view showing first inner adhesive layers and second inner adhesive layers respectively formed on the first inner wiring layers and the second inner wiring layers of FIG. 6, and first cover layers formed on the first inner adhesive layers.

At step S103, referring to FIG. 7, two first inner adhesive layers 322 are formed on surfaces of the first inner wiring layers 3212 and two second inner adhesive layers 352 are formed on surfaces of the second inner wiring layers 3512. Each of the first inner adhesive layers 322 encapsulates the entirety of one of the first inner wiring layers 3212 in the first to fourth areas S1-S4. Portions of the first inner adhesive layers 322 in different areas are apart from each other.

The first cover layer 327 covers a surface of one of the first inner adhesive layers 322.

Figure 8:
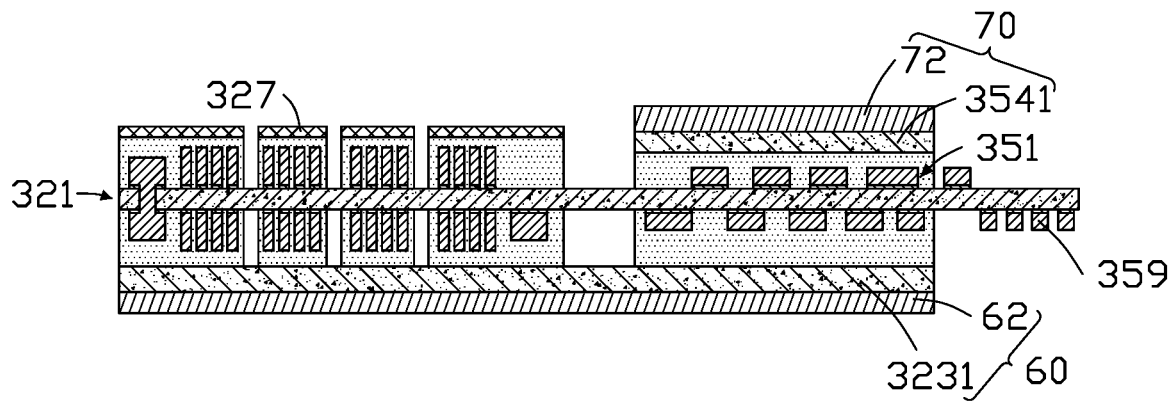
FIG. 8 is a cross-sectional view showing a first single-sided copper clad laminate and a second single-sided copper clad laminate laminated on both sides of the structure shown in FIG. 7.

At step S104, referring to FIGS. 7 and 8, a first single-sided copper clad laminate 60 and a second single-sided copper clad laminate 70 are provided. The first single-sided copper clad laminate 60 is laminated onto surfaces of one of the first inner wiring layers 3212 and one of the second inner wiring layers 3512, and the second single-sided copper clad laminate 70 is laminated onto a surface of another one of the second inner wiring layers 3512.

The first single-sided copper clad laminate 60 includes the second dielectric layer 3231 and a second copper layer 62 on a surface of the second dielectric layer 3231. The second copper layer 62 is disposed on the surface of the second dielectric layer 3231 away from the first inner wiring layer 3212 and the second inner wiring layer 3512.

The second single-sided copper clad laminate 70 includes the fourth dielectric layer 3541 and a third copper layer 72 on a surface of the fourth dielectric layer 3541. The third copper layer 72 is disposed on the surface of the fourth dielectric layer 3541 away from the second inner wiring layer 3512.

Figure 9:
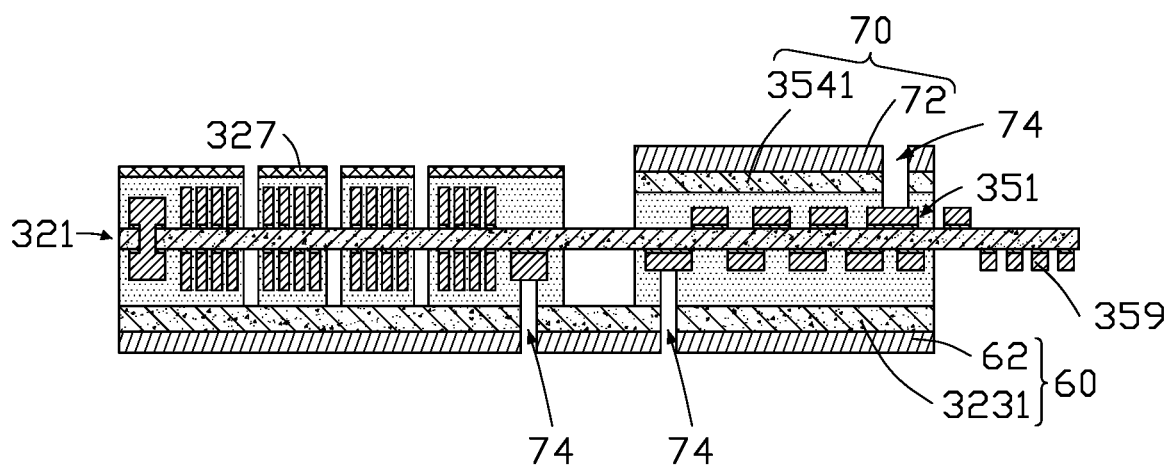
FIG. 9 is a cross-sectional view showing second through holes formed on the first and second single-sided copper clad laminates of FIG. 8.

At step S105, referring to FIG. 9, a plurality of second through holes 74 are formed to expose portions of the first inner wiring layer 3212 and the second inner wiring layer 3512.

One of the second through holes 74 penetrates the first single-sided copper clad laminate 60 and the first inner adhesive layer 322 corresponding to the first single-sided copper clad laminate 60, so that a portion of the first inner wiring layer 3212 is exposed from the second through hole 74. Another second through hole 74 penetrates the second single-sided copper clad laminate 70 and the second inner adhesive layer 352 corresponding to the second single-sided copper clad laminate 70, so that a portion of the second inner wiring layer 3512 is exposed from the second through hole 74. The second through holes 74 can be formed by mechanical drilling or laser drilling. In one embodiment, the second through holes 74 are formed by laser drilling.

Figure 10:
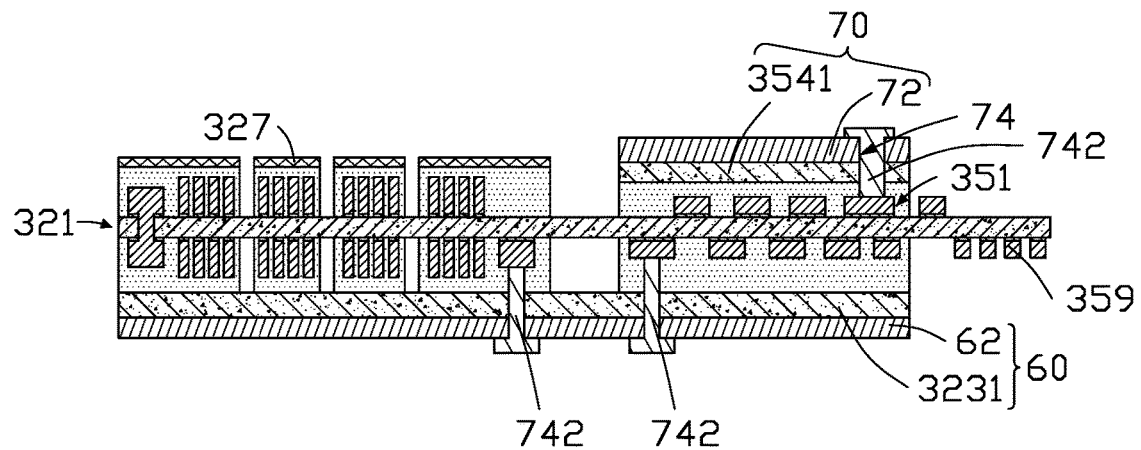
FIG. 10 is a cross-sectional view showing second conductive pillars formed in the second through holes of FIG. 9.

At step S106, referring to FIG. 10, second conductive pillars 742 are formed in the second through holes 74.

Figure 11:
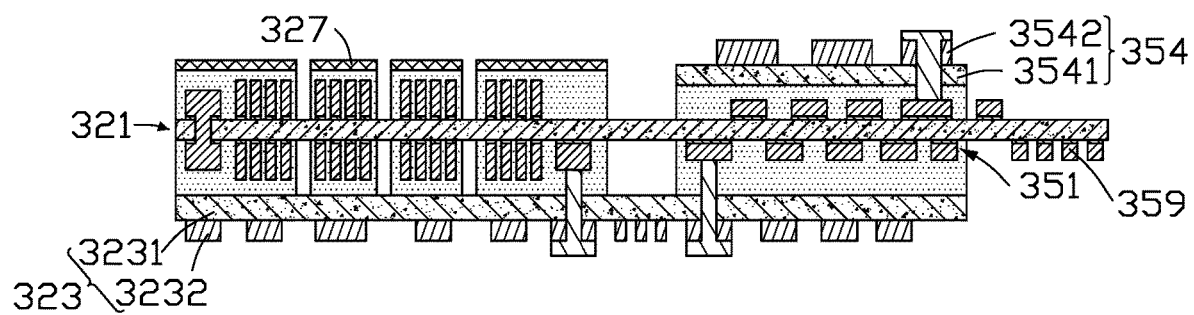
FIG. 11 is a cross-sectional view showing an outer wiring layer and a third inner wiring layer respectively formed from the first and second single-sided copper clad laminates of FIG. 10.

At step S107, referring to FIG. 11, the outer wiring layer 3232 and the third inner wiring layer 3542 are formed.

One second conductive pillar 742 electrically connects the outer wiring layer 3232 and the second copper layer 62, and another second conductive pillar 742 electrically connects the outer wiring layer 3232 and the second inner wiring layer 3512.

In one embodiment of a method, the outer wiring layer 3232 and the third inner wiring layer 3542 are formed by steps of pressing a film, exposure, development, etching, and stripping the film. Specifically, portions of the second copper layer 62 of the first single-sided copper clad laminate 60 are removed by etching to form the outer wiring layer 3232, and portions of the third copper layer 72 of the second single-sided copper clad laminate 70 are removed by etching to form the third inner wiring layer 3542.

Figure 12:
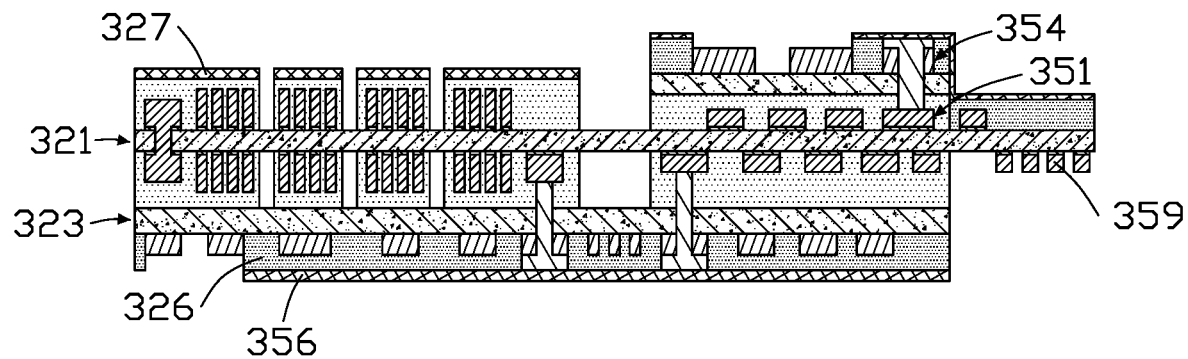
FIG. 12 is a cross-sectional view showing an outer adhesive layer and a second cover layer formed on the structure shown in FIG. 11.

At step S108, referring to FIG. 12, two outer adhesive layers 326 are formed onto surfaces of the outer wiring layer 3232 and the third inner wiring layer 3542, and the second cover layers 356 cover surfaces of the outer adhesive layers 326.

Figure 13:
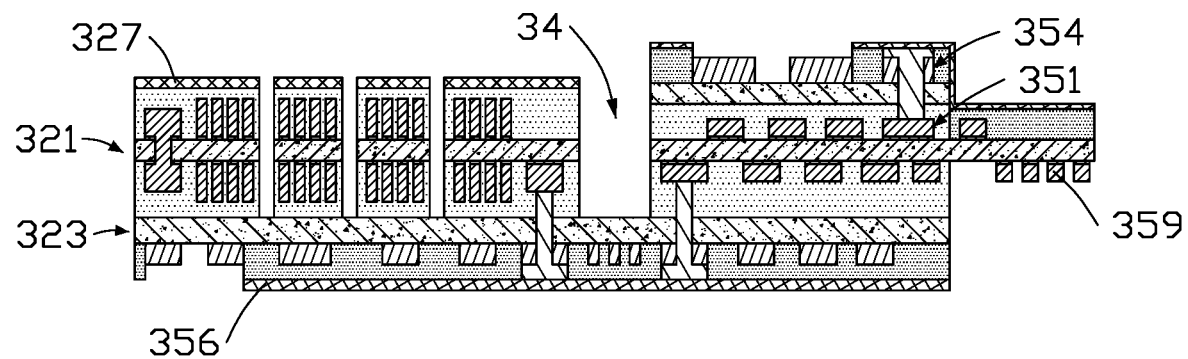
FIG. 13 is a cross-sectional view showing a first opening and second openings formed on a first dielectric layer in the structure shown in FIG. 12.

At step S109, referring to FIG. 13, a portion of the first dielectric layer 3211 between the first inner wiring layers 3212 and the second inner wiring layers 3512 is etched to form the first opening 34, and portions of the first dielectric layer 3211 between adjacent areas of the first to fourth areas S1-S4 are etched to form the second openings 324.

Figure 14:
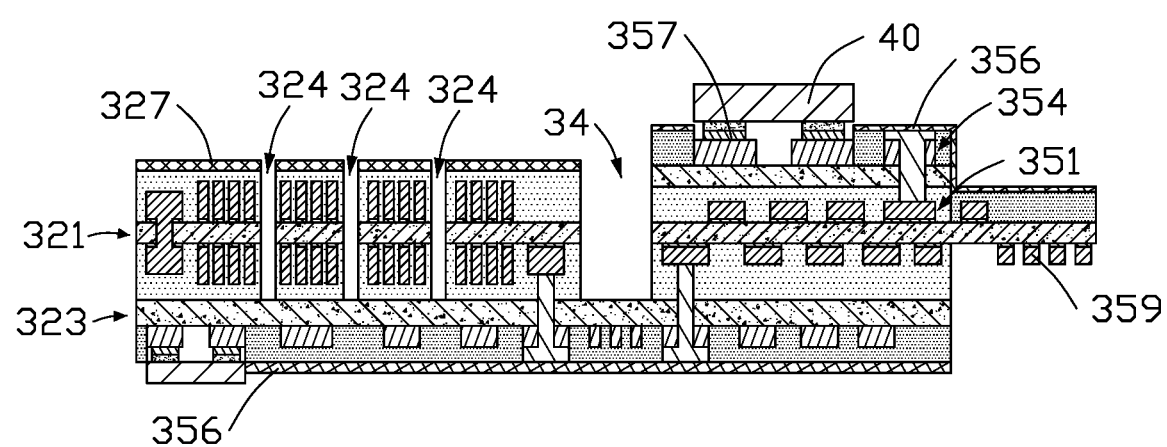
FIG. 14 is a cross-sectional view showing second connection pads formed on the structure shown in FIG. 13, and electronic components assembled on the second connection pads.

At step S110, referring to FIG. 14, parts of a surface of the third inner wiring layer 3542 are plated with gold to form the second connection pads 357, and the electronic component 40 is mounted on and is electrically connected with the second connection pads 357.

At step S111, one reinforcing plate 358 is mounted on an orthographic projection area of the outer wiring layer 3232 onto the surface of the second cover layer 356 away from the outer wiring layer 3232, and another reinforcing plate 358 is mounted on an orthographic projection area of the electric connection portion 359 onto the surface of the second cover layer 356 away from the outer wiring layer 3232, thereby obtaining the circuit board assembly 30 (shown in FIG. 3).

At step S2, the holder 10 and the lens 20 are provided, the lens 20 is mounted into the holder 10, and the magnets 25 are mounted onto the outer wall 12 of the holder 10.

At step S3, the circuit board assembly 30 is bent, so that the first inner wiring substrate 321 surrounds the outer wall 12 of the holder 10. Each of the coils 3213 corresponds to one magnet 25, thereby obtaining the camera module 100. The circuit board assembly 30 is bent in the areas where the first opening 34 and the second openings 324 are located.

The coils 3213 are directly formed on the first dielectric layer 3211, which facilitates miniaturization of the camera module 100. In addition, the resistance of each of the coils 3213 is reduced by controlling the line width W and the wire pitch S in each of the coils 3213, thereby reducing the power consumption of the camera module 100.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A camera module comprising:
a holder comprising an inner cavity and an outer wall;
a lens accommodated in the inner cavity;
a plurality of magnets arranged on the outer wall; and
a circuit board assembly, the circuit board assembly comprising:
an outer wiring substrate;
a first inner wiring substrate surrounding the holder and disposed on a surface of the outer wiring substrate facing the holder, wherein the first inner wiring substrate comprises a first dielectric layer and a first inner wiring layer on a surface of the first dielectric layer, the first inner wiring layer comprises a plurality of coils formed by winding conductive wires of the first inner wiring layer, each of the plurality of coils corresponds to one of the plurality of magnets; and
a second inner wiring substrate disposed on the surface of the outer wiring substrate with the first inner wiring substrate, wherein a first opening is defined between the first inner wiring substrate and the second inner wiring substrate, the second inner wiring substrate comprises a second inner wiring layer, a thickness of each of the plurality of coils is greater than a thickness of the second inner wiring layer.

2. The camera module of claim 1, wherein the circuit board assembly further comprises a plurality of second openings, the plurality of second openings respectively penetrate the first inner wiring substrate to divide the first inner wiring layer into the plurality of coils.

3. The camera module of claim 2, wherein a ratio of the thickness of each of the plurality of coils to a wire pitch between two adjacent conductive wires in each of the plurality of coils is greater than three.

4. The camera module of claim 1, wherein the circuit board assembly further includes a third inner wiring substrate disposed on a side of the second inner wiring substrate away from the outer wiring substrate, the third inner wiring substrate is configured to connect an electronic component.

5. The camera module of claim 4, wherein the first inner wiring substrate comprises two first inner wiring layers disposed on both surfaces of the first dielectric layer, the two first inner wiring layers are electronically connected to each other, each of the two first inner wiring layers comprises the plurality of coils.

6. The camera module of claim 5, wherein the circuit board assembly further comprises a first cover layer and two first inner adhesive layers, the two first inner adhesive layers are disposed on both surfaces of the first dielectric layer and respectively encapsulate the two first inner wiring layers, the first inner wiring substrate is bonded to the outer wiring substrate through one of the two first inner adhesive layers, and the first cover layer covers a surface of the other one of the two first inner adhesive layers away from the first dielectric layer.

7. The camera module of claim 6, wherein the second inner wiring substrate comprises a third dielectric layer and two second inner wiring layers disposed on both surfaces of the third dielectric layer, the outer wiring substrate and the third inner wiring substrate are bonded to the two second inner wiring layers through two second inner adhesive layers, the two second inner adhesive layers encapsulate the two second inner wiring layers.

8. The camera module of claim 6, wherein the outer wiring substrate comprises a second dielectric layer and an outer wiring layer disposed on a surface of the second dielectric layer, the first inner wiring substrate and the second inner wiring substrate are disposed on a surface of the second dielectric layer away from the outer wiring layer.

9. The camera module of claim 8, wherein the circuit board assembly further comprises an outer adhesive layer and a second cover layer, the outer adhesive layer covers the outer wiring layer and a surface of the third inner wiring substrate away from the second inner wiring substrate, and the second cover layer covers the outer adhesive layer.

10. A method for manufacturing a camera module, comprising:
providing a holder, a lens, and a plurality of magnets, the holder comprising an inner cavity and an outer wall;
mounting the lens into the inner cavity, and mounting the plurality of magnets onto the outer wall;
providing a circuit board assembly, wherein the circuit board assembly comprises an outer wiring substrate, a first inner wiring substrate, and a second inner wiring substrate, the first inner wiring substrate and the second inner wiring substrate are disposed on a same surface of the outer wiring substrate, a first opening is defined between the first inner wiring substrate and the second inner wiring substrate, the first inner wiring substrate comprises a first dielectric layer and two first inner wiring layers on both surfaces of the first dielectric layer, each of the two first inner wiring layer comprises a plurality of coils formed by winding conductive wires of the first inner wiring layer, the second inner wiring substrate comprises two second inner wiring layers, a thickness of each of the plurality of coils is greater than a thickness of each of the two second inner wiring layers; and bending the circuit board assembly along the first opening, so that the first inner wiring substrate surrounds the outer wall, and each of the plurality of coils corresponds to one of the plurality of magnets.

11. The method of claim 10, wherein providing a circuit board assembly comprises:

providing a double-sided copper clad laminate, the double-sided copper clad laminate comprising the first dielectric layer and two first copper layers on both surfaces of the first dielectric layer;

forming two first inner wiring layers from the two first copper layers to obtain the first inner wiring substrate, each of the two first inner wiring layers comprising a plurality of areas, each of the plurality of areas comprising one of the plurality of coils;

forming two second inner wiring layers from the two first copper layers to obtain the second inner wiring substrate;

laminating a first single-sided copper clad laminate onto one of the two first inner wiring layers and one of the two second inner wiring layers which are on a same surface of the first dielectric layer, the first single-sided copper clad laminate comprising a second dielectric layer and a second copper layer on a surface of the second dielectric layer; and etching the second copper layer to form an outer wiring layer, thereby obtaining the outer wiring substrate.

12. The method of claim 11, further comprising:

forming two first inner adhesive layers on surfaces of the two first inner wiring layers, portions of each of the two first inner adhesive layers in the plurality of areas are spaced from each other.

13. The method of claim 12, further comprising:

etching portions of the first dielectric layer between adjacent coils to form a plurality of second openings;

etching a portion of the first dielectric layer between the two first inner wiring layers and the two second inner wiring layers to form the first opening; and bending the circuit board assembly along the plurality of second openings.

14. The method of claim 13, further comprising:

providing a second single-sided copper clad laminate;

laminating the second single-sided copper clad laminate onto a surface of the second inner wiring substrate away from the outer wiring substrate;

forming a through hole on the second single-sided copper clad laminate;

forming a conductive pillar in the through hole; and connecting an electronic component to the conductive pillar.

15. The method of claim 14, further comprising:

forming a first cover layer on a surface of one of the two first inner adhesive layers away from the outer wiring substrate.

* * * * *